US011125847B2

(12) United States Patent
Eck et al.

(10) Patent No.: US 11,125,847 B2
(45) Date of Patent: Sep. 21, 2021

(54) SYSTEM AND METHOD FOR OUT-OF-VIEW ARTIFACT SUPPRESSION FOR MAGNETIC RESONANCE FINGERPRINTING

(71) Applicant: Case Western Reserve University, Cleveland, OH (US)

(72) Inventors: Brendan Eck, Cleveland Heights, OH (US); Jesse Hamilton, Cleveland Heights, OH (US); Nicole Seiberlich, Shaker Heights, OH (US); Mark Griswold, Shaker Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 0 days.

(21) Appl. No.: 16/858,177

(22) Filed: Apr. 24, 2020

(65) Prior Publication Data

US 2020/0341102 A1    Oct. 29, 2020

Related U.S. Application Data

(60) Provisional application No. 62/838,600, filed on Apr. 25, 2019.

(51) Int. Cl.
*G01R 33/565* (2006.01)
*G01R 33/50* (2006.01)
*G01R 33/48* (2006.01)

(52) U.S. Cl.
CPC ... *G01R 33/56545* (2013.01); *G01R 33/4824* (2013.01); *G01R 33/4828* (2013.01); *G01R 33/50* (2013.01)

(58) Field of Classification Search
CPC .............. G01R 33/56545; G01R 33/50; G01R 33/4824; G01R 33/4828
See application file for complete search history.

(56) References Cited

U.S. PATENT DOCUMENTS

| 8,723,518 B2 | 5/2014 | Seiberlich |
| 2015/0301141 A1 | 10/2015 | Griswold |

(Continued)

OTHER PUBLICATIONS

Fessler, J.A. Michigan image reconstructions toolbox (MIRT). [Online]. Available: https://web.eecs.umich.edu/~fessler/code/index.html. Version dated Apr. 18, 2019.

(Continued)

*Primary Examiner* — G. M. A Hyder
(74) *Attorney, Agent, or Firm* — Quarles & Brady LLP

(57) ABSTRACT

A method for magnetic resonance fingerprinting with out-of-view artifact suppression includes acquiring MRF data from a region of interest in a subject. The MRF data is acquired using a non-Cartesian, variable density sampling trajectory. The MRF data includes data from within a desired field-of-view and data from outside the desired field-of-view. The method also includes generating a set of coil images based on the MRF data with a field-of-view larger than the desired field-of-view, determining a noise covariance based on the MRF data from outside the desired field-of-view, generating a coil combined image using an adaptive coil combination determined based on the noise covariance, applying the adaptive coil combination to the MRF data to grid each frame of the MRF data and generate MRF data with out-of-view artifact suppression. The method also includes identifying at least one property of the MRF data and generating a report.

12 Claims, 4 Drawing Sheets

(56) References Cited

U.S. PATENT DOCUMENTS

2015/0346300 A1* 12/2015 Setsompop ........ G01R 33/4828
324/309
2016/0282430 A1* 9/2016 Gulani ............... G01R 33/4828

OTHER PUBLICATIONS

Fessler, J.A., et al. "Nonuniform fast Fourier transforms using min-max interpolation." IEEE transactions on signal processing 51.2 (2003): 560-574.
Hamilton, J. I., et al. "Simultaneous multislice cardiac magnetic resonance fingerprinting using low rank reconstruction." NMR in Biomedicine 32.2 (2019): e4041. First published Dec. 18, 2018.
Ma, D. et al., in "Magnetic Resonance Fingerprinting," Nature, 2013; 495 (7440): 187-192.
Mandava, S., et al. "Radial streak artifact reduction using phased array beamforming." Magnetic resonance in medicine 81.6 (2019): 3915-3923. First published Feb. 12, 2019.
Mehta, B. B., et al. "Image reconstruction algorithm for motion insensitive MR Fingerprinting (MRF): MORF." Magnetic Resonance in Medicine 80.6 (2018): 2485-2500.
Pierre, E. Y., et al. "Multiscale reconstruction for MR fingerprinting." Magnetic resonance in medicine 75.6 (2016): 2481-2492.
Walsh, D. O., et al. (2000). Adaptive reconstruction of phased array MR imagery. Magnetic Resonance in Medicine: An Official Journal of the International Society for Magnetic Resonance in Medicine, 43(5), 682-690.
Zhao, B., et al. "Maximum likelihood reconstruction for magnetic resonance fingerprinting." IEEE transactions on medical imaging 35.8 (2016): 1812-1823.

* cited by examiner

SYSTEM AND METHOD FOR OUT-OF-VIEW ARTIFACT SUPPRESSION FOR MAGNETIC RESONANCE FINGERPRINTING

CROSS-REFERENCE TO RELATED APPLICATION

This application is based on, claims priority to, and incorporates herein by reference in its entirety U.S. Ser. No. 62/838,600 filed Apr. 25, 2019, and entitled "System and Method For Out-Of-View Artifact Suppression For Magnetic Resonance Fingerprinting."

STATEMENT REGARDING FEDERALLY SPONSORED RESEARCH

This invention was made with government support under the grants R01HL094557 and R01DK098502 awarded by the National Institutes of Health, and the grant 1553441 awarded by the National Science Foundation. The government has certain rights in the invention.

BACKGROUND

Characterizing tissue species using nuclear magnetic resonance ("NMR") can include identifying different properties of a resonant species (e.g., T1 spin-lattice relaxation, T2 spin-spin relaxation, proton density). Other properties like tissue types and super-position of attributes can also be identified using NMR signals. These properties and others may be identified simultaneously using magnetic resonance fingerprinting ("MRF"), which is described, as one example, by D. Ma, et al., in "Magnetic Resonance Fingerprinting," *Nature,* 2013; 495 (7440): 187-192.

Conventional magnetic resonance imaging ("MRI") pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T!-weighted signal at a first echo time ("TE"), while a second pulse sequence may produce a T2-weighted signal at a second TE. These conventional pulse sequences typically provide qualitative results where data are acquired with various weighting or contrasts that highlight a particular parameter (e.g., T1 relaxation, T2 relaxation).

When magnetic resonance ("MR") images are generated, they may be viewed by a radiologist and/or surgeon who interprets the qualitative images for specific disease signatures. The radiologist may examine multiple image types (e.g., T1-weighted, T2 weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional MRI, MRF employs a series of varied sequence blocks that simultaneously produce different signal evolutions in different resonant species (e.g., tissues) to which the radio frequency ("RF") is applied. The signals from different resonant tissues will, however, be different and can be distinguished using MRF. The different signals can be collected over a period of time to identify a signal evolution for the volume. Resonant species in the volume can then be characterized by comparing the signal evolution to known signal evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary.

Currently, MRF parameter or property maps are produced without any suppression of undersampling artifacts that originate from outside the desired field-of-view. Typically, the out-of-view artifact contribution across parallel receive coils is either assumed to be equal or requires manual selection of a region-of-interest for artifact suppression. This sub-optimal use of coil information limits the quality of MRF images and subsequent parameter estimates.

It would be desirable to provide a system and method that suppresses artifacts originating from outside the desired field of view for magnetic resonance fingerprinting. Suppressing out-of-view artifacts may improve, for example, image quality, temporal resolution, and spatial resolution of MRF maps.

SUMMARY OF THE DISCLOSURE

In accordance with an embodiment, a method for magnetic resonance fingerprinting with out-of-view artifact suppression includes acquiring MRF data from a region of interest in a subject using the MRI system, where the MRF data is acquired using a non-Cartesian, variable density sampling trajectory. The MRF data includes data from within a desired field-of-view and data from outside the desired field-of-view/The method also includes generating a set of coil images based on the MRF data with a field-of-view larger than the desired field-of-view, determining a noise covariance based on the MRF data from outside the desired field-of-view, generating a coil combined image using an adaptive coil combination determined based on the noise covariance, applying the adaptive coil combination to the MRF data to grid each frame of the MRF data and generate MRF data with out-of-view artifact suppression, comparing the MRF data with out-of-view artifact suppression to an MRF dictionary to identify at least one property of the MRF data and generating a report indicating the at least one property of the MRF data.

In accordance with another embodiment, a magnetic resonance fingerprinting (MRF) system includes a magnet system configured to generate a polarizing magnetic field about at least a portion of a subject, a magnetic gradient system including a plurality of magnetic gradient coils configured to apply at least one magnetic gradient field to the polarizing magnetic field and a radio frequency (RF) system configured to apply an RF field to the subject and to receive magnetic resonance signals from the subject using a coil array. The MRF system further includes a computer system programmed to acquire MRF data from a region of interest in a subject using the MRI system, where the MRF data is acquired using a non-Cartesian, variable density sampling trajectory. The MRF data includes data from within a desired field-of-view and data from outside the desired field-of-view. The computer system is further programmed to generate a set of coil images based on the MRF data with a field-of-view larger than the desired field-of-view, determine a noise covariance based on the MRF data from outside the desired field-of-view, generate a coil combined image using an adaptive coil combination determined based on the noise covariance, apply the adaptive coil combination to the MRF data to grid each frame of the MRF data and generate MRF data with out-of-view artifact suppression, compare the MRF data with out-of-view artifact suppression to an MRF dictionary to identify at least one property of the MRF data and generate a report indicating the at least one property of the MRF data.

BRIEF DESCRIPTION OF THE DRAWINGS

The present invention will hereafter be described with reference to the accompanying drawings, wherein like reference numerals denote like elements.

DETAILED DESCRIPTION

Figure 1:
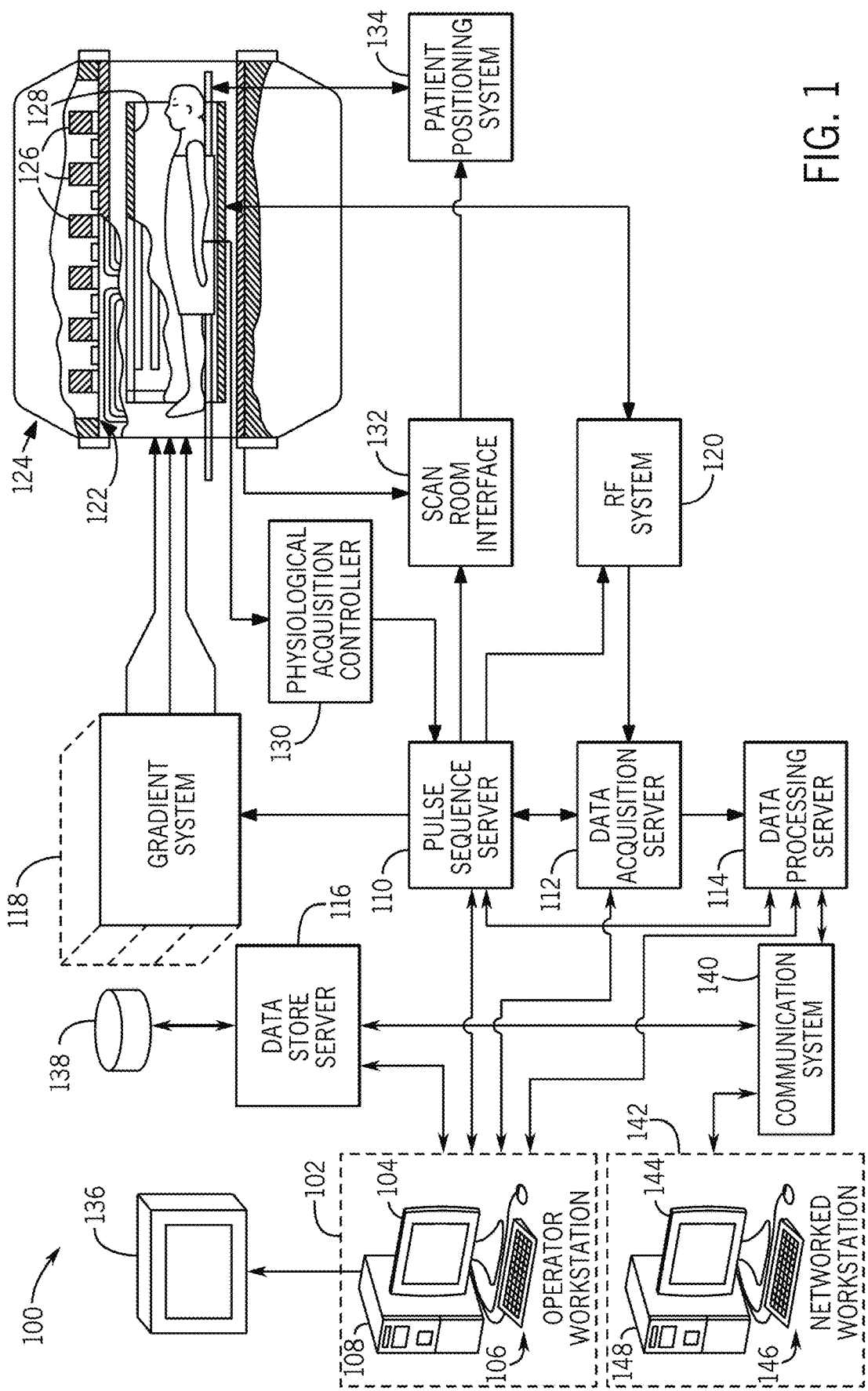
FIG. 1 is a schematic diagram of an example MRI system in accordance with an embodiment.

Magnetic resonance fingerprinting ("MRF") is a technique that facilitates mapping of tissue or other material properties based on random or pseudorandom measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, then both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE'), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

From these measurements, which as mentioned above may be random or pseudorandom, or may contain signals from different materials or tissues that are spatially incoherent, temporally incoherent, or both, MRF processes can be designed to map any of a wide variety of parameters or properties. Examples of such parameters or properties that can be mapped may include, but are not limited to, tissue parameters or properties such as longitudinal relaxation time ($T_1$), transverse relaxation time ($T_2$), and proton density ($\varphi$), and device dependent parameters such as main or static magnetic field map ($B_0$). MRF is generally described in U.S. Pat. No. 8,723,518 and Published U.S. Patent Application No. 2015/0301141, each of which is incorporated herein by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the physical properties, such as those mentioned above. As an example, the comparison of the acquired signals to a dictionary can be performed using any suitable matching or pattern recognition technique. The properties for the tissue or other material in a given voxel are estimated to be the values that provide the best signal template matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative properties, which can be extracted from the selected signal vector and used to generate the relevant quantitative property maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad (1)$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $R_i(\alpha)$ is a rotation due to off resonance; $R_{RF_{ij}}(\alpha, \phi)$ is a rotation due to RF differences; R(G) is a rotation due to a magnetic field gradient; $T_1$ is a longitudinal, or spin-lattice, relaxation time; $T_2$ is a transverse, or spin-spin, relaxation time; D is diffusion relaxation; $E_i(T_1, T_2, D)$ is a signal decay due to relaxation differences; and $M_0$ is the magnetization in the default or natural alignment to which spins align when placed in the main magnetic field.

While $E_i(T_1, T_2, D)$ is provided as an example, in different situations, the decay term, $E_i(T_1, T_2, D)$, may also include additional terms, $E_i(T_1, T_2, D, \ldots)$ or may include fewer terms, such as by not including the diffusion relaxation, as $E_i(T_1, T_2)$ or $E_i(T_1, T_2, \ldots)$. Also, the summation on "j" could be replace by a product on "j". The dictionary may store signals described by, $$S_i = R_i E_i(S_{i-1}) \quad (2);$$

where $S_0$ is the default, or equilibrium, magnetization; $S_i$ is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the $i^{th}$ previous signal at acquisition block (i.e., the $(i-1)^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

Thus, in MRF, a unique signal timecourse is generated for each pixel. This timecourse evolves based on both physiological tissue properties such as T1 or T2 as well as acquisition parameters like flip angle (FA) and repetition time (TR). This signal timecourse can, thus, be referred to as a signal evolution and each pixel can be matched to an entry in the dictionary, which is a collection of possible signal evolutions or timecourses calculated using a range of possible tissue property values and knowledge of the quantum physics that govern the signal evolution. Upon matching the measured signal evolution/timecourse to a specific dictionary entry, the tissue properties corresponding to that dictionary entry can be identified. A fundamental criterion in MRF is that spatial incoherence be maintained to help separate signals that are mixed due to undersampling. In other words, signals from various locations should differ from each other, in order to be able to separate them when aliased.

To achieve this process, a magnetic resonance imaging (MRI) system or nuclear magnetic resonance (NMR) system may be utilized. FIG. 1 shows an example of an MRI system 100 that may be used to perform magnetic resonance fingerprinting. In addition, MRI system 100 may be used to implement the methods described herein. MRI system 100 includes an operator workstation 102, which may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MRI system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (3);$$

and the phase of the received magnetic resonance signal may also be determined according to the following relationship:

$$\varphi = \tan^{-1}\left(\frac{Q}{I}\right). \qquad (4)$$

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110. For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MIRA") scan. For example, the data acquisition server 112 may acquire magnetic resonance data and processes it in real-time to produce information that is used to control the scan.

The data processing server 114 receives magnetic resonance data from the data acquisition server 112 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MRI system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

The present disclosure describes a system and method for reducing undersampling artifacts in magnetic resonance imaging (MRI) acquired using non-Cartesian gradient trajectories and parallel receive coils. In particular, signals originating from outside a desired field-of-view are suppressed, herein referred to as "out-of-view artifact suppression." Accordingly, aliasing artifacts from structures outside the desired field-of-view are reduced. In an embodiment, the method for suppressing out-of-view artifacts may be used as part of an image reconstruction pipeline for magnetic resonance fingerprinting (MRF). Suppressing out-of-view artifacts in magnetic resonance fingerprinting can lead to improvements in image quality, temporal resolution, and/or spatial resolution. In addition, the SNR (signal-to-noise ratio) of MRF data may be improved which can lead to improvements in MRF parameter (or property) quantification maps, for example, T1 and T2 maps. Improvement in MRF maps can enable more precise and accurate quantification of T1, T2, proton density, apparent diffusion coefficient, and other quantitative tissue properties. Such properties are applicable to the assessment of various pathologies. The out-of-view artifact suppression may be used with any application where objects or structures outside of a desired field of view produce appreciable aliasing artifacts, for example, cardiac imaging, coronal imaging of the abdomen, sagittal/coronal imaging of the head, etc.

Figure 2:
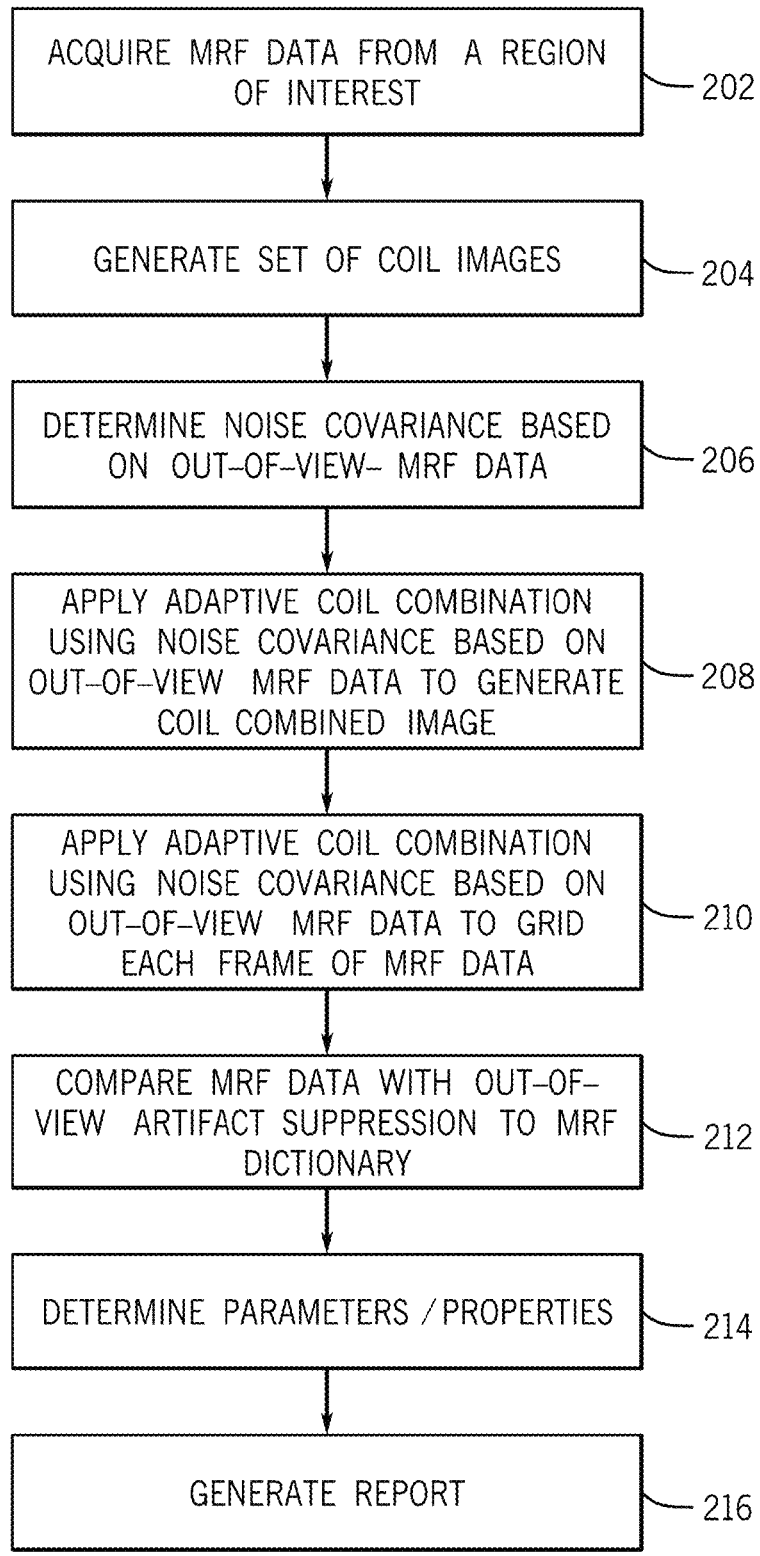
FIG. 2 illustrates a method for suppression of out-of-view artifacts in magnetic resonance fingerprinting in accordance with an embodiment.

FIG. 2 illustrates a method for suppression of out-of-view artifacts in magnetic resonance fingerprinting in accordance with an embodiment. At block 202, MRF data is acquired from tissue in a region of interest in a subject using, for example, an MRI system (e.g., MRI system 100 shown in FIG. 1). In an embodiment, the MRF data is acquired using a non-Cartesian, variable density k-space sampling trajectory using a parallel receive coil array. The non-Cartesian data acquisition encodes the MR signals at effectively different fields of view. The acquired MRF data includes both data from a desired field-of-view and data from outside the desired field-of-view. The MRF data may be stored in memory or data storage of, for example, an MRI system (e.g., the MRI system 100 of FIG. 1) or other computer system. At block 204, a set of coil images is generated. In an embodiment, the set of coil images are generated with a field-of-view larger than the desired field-of-view. In MRF, time-series data (MRF data) in the spatial frequency domain (k-space) may be collected from multiple receive coils and then transformed into the image domain and combined into a single, coil-combined image. In order to determine the appropriate coil combination, the k space data, $K(k_x, k_y, t, j)$, is transformed to a set of coil images, $C_j(x,y,t,j)$, using a 2D non-uniform fast Fourier transform, where K is the original k-space data, C is the complex-valued set of coil images, $k_x$ is the spatial frequency corresponding to the x-direction, $k_y$ is the spatial frequency corresponding to the y-direction, t is the time in the MRF time-series, and the j subscript denotes the coil index corresponding to $j=1,2,\ldots,N_c$ for $N_c$ coils. A time-averaged set of coil images, $\overline{C}_j(x, y)$ is used to determine a coil combination which will be applied to each of the image frames.

At block 206, a noise covariance is determined based on MRF data from outside the desired field-of-view. Specifically, the noise covariance matrix in adaptive coil combination is computed from pixels outside the desired field-of-view. A coil combination is determined using the set of time-averaged coil images. In an embodiment, an image, I(x, y), is reconstructed by linearly combining individual coil images $\overline{C}_j(x,y)$, where $j=1,\ldots,N_c$ for $N_c$ coils, using the complex filter vector $m_j^*$, where * denotes the complex conjugate, $$I(x,y)=\Sigma_{j=1} m_j^* \overline{C}_j(x,y) \qquad \text{Eq. (5)}$$

In an embodiment, a coil combination $m_j$ that maximizes the signal relative to the noise is determined. Given knowledge of the signal coil covariance matrix, $R_S$, and the noise coil covariance, $R_n$, an optimal selection of $m_j$ can be determined using the eigenvalue decomposition of the matrix P where $P=R_n^{-1}R_S$. That is, the matrices V and D are determined such that $$PV=VD \qquad \text{Eq. (6)}$$

where D is a diagonal matrix of eigenvalues sorted from largest to smallest by convention and V contains the corresponding eigenvectors organized by column. The first eigenvector of V, also the first column of V, then corresponds to the optimal linear coil combination given known $R_n$ and $R_S$, $$M=V(:,1) \qquad \text{Eq. (7)}$$

Adaptive phase alignment is applied by multiplying m by the phase of the j-th coil, typically the coil with maximum signal intensity, $$m_j=me^{i\theta}{}_j \qquad \text{Eq. (8)}$$

The final coil-combined image is strongly influenced by the structure of the signal coil covariance matrix, $R_S$, and the noise coil covariance, $R_n$, with an emphasis on $R_n$ for out-of-view artifact suppression. $R_S$ is determined by the local coil signal at each pixel location or over small regions. As mentioned, $R_n$ is structured in order to suppress the source of out-of-view artifacts. Accordingly, pixels outside the desired field-of-view (e.g., from the set of MRF data from outside the desired field-of-view) are used to compute $R_n$. In an embodiment, coil images are gridded onto a temporary field-of-view that is larger than the desired field-of-view, a pre-defined mask is applied to select only pixels outside of the desired field-of-view, and $R_n$ is computed using those masked pixels. At block 208, the adaptive coil combination using the noise covariance based on the out-of-view MR data is applied to generate a coil combined image. In an embodiment, the final coil combined image with out-of-view artifact suppression is generated using the spatially-varying adaptive coil combination vectors, $m_j$, described above. Because the mask for calculation of $R_n$ is already defined, no additional input is necessary by the user beyond that normally required for the scan, for example, using MRI system 100 shown in FIG. 1.

At block 210, the adaptive coil combination using the noise covariance based on the out-of-view MR data is applied to grid each frame of the MRF data. In particular, the same coil combination determined from the time-averaged data (as described above) is applied to grid each image frame in the MRF sequence. That is, equation (1) is adapted as $$I(x,y,t) = \Sigma_{j=1}^N m_j^* C_j(x,y,t) \quad \text{Eq. (9)}$$

From these coil-combined, undersampled MRF frames, MRF parameter or property maps may be generated using any of a number of image reconstruction algorithms.

The MRF data with out-of-view artifact suppression at block 210 may be stored, for example, in memory or data storage of, for example, an MRI system (e.g., the MRI system 100 of FIG. 1) or other computer system. The MRF data with out-of-view artifact suppression is compared to the MRF dictionary at block 212 to match the acquired signal evolutions with signal evolutions stored in the MRF dictionary. The MRF dictionary may be stored in memory or data storage of, for example, an MRI system (e.g., the MRI system 100 of FIG. 1) or other computer system. The MRF dictionary includes known signal evolutions (e.g., simulated signal evolutions). Comparing the MRF data with out-of-view artifact suppression to the MRF dictionary may be performed in a number of ways such as, for example, using a pattern matching, template matching or other matching algorithm. In one embodiment, the inner products between the normalized measured time course of each pixel and all entries of the normalized dictionary are calculated, and the dictionary entry corresponding to the maximum value of the inner product is taken to represent the closest signal evolution to the acquired signal evolution. At block 214, one or more parameters or properties of the MRF data with out-of-view artifact suppression are determined based on the comparison and matching at block 212. The parameters and properties may include, for example, longitudinal relaxation time (T1), transverse relaxation time (T2), main or static magnetic field ($B_0$) and proton density (PD). At block 216, a report may be generated indicating at least one of the identified parameters or properties for the tissue in a region of interest in a subject. For example, the report may include a quantitative indication of the at least one parameter or property. The report may include, for example, images or maps, text or metric based reports, audio reports and the like. The report may be provided to a display (e.g., display 104, 136 or 144 shown in FIG. 1).

Figure 3:
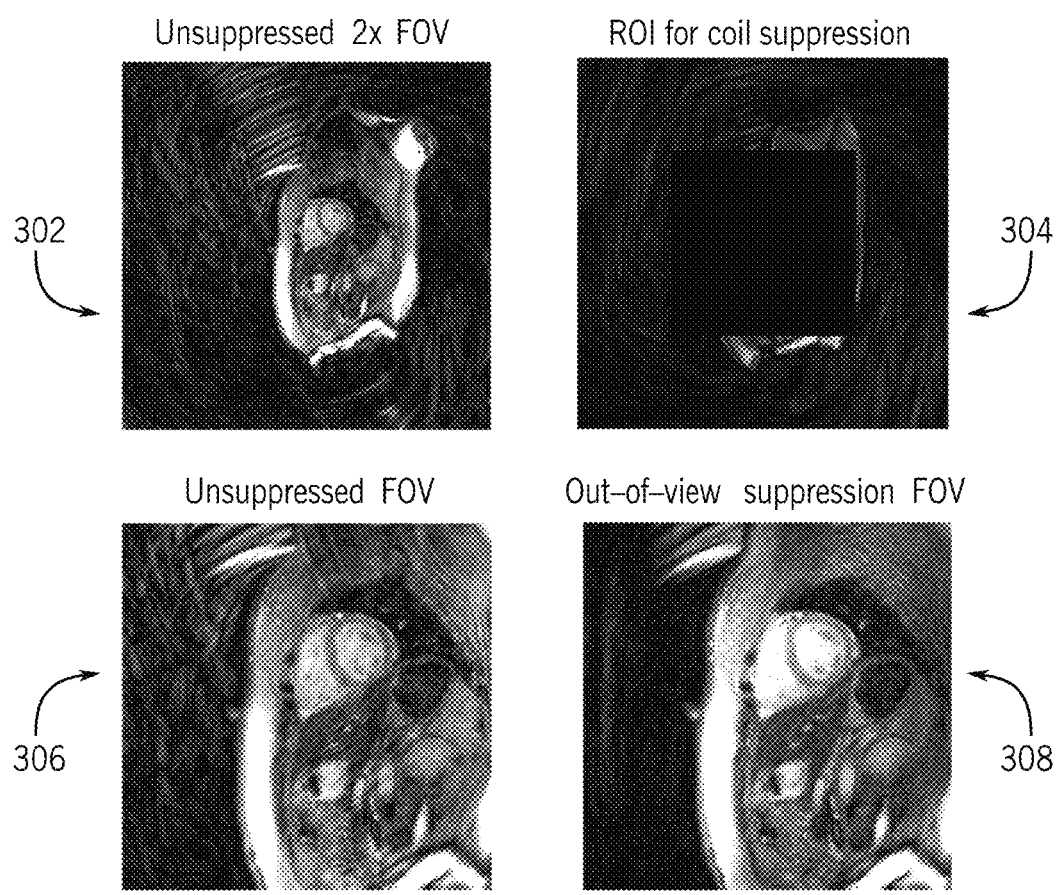
FIG. 3 shows images illustrating various stages of a method for suppression of out-of-view artifacts for an example application to cardiac MRF in accordance with an embodiment.

In an example, the out-of-view artifact suppression was used in cardiac MRF (cMRF). Cardiac MRF is often performed in a double-oblique, short axis orientation. This orientation often involves anatomy with a larger spatial extent than the desired field-of-view, e.g., abdominal tissues and/or arms are still in the imaging plane but lie outside of the desired 300×300 mm$^2$ field-of-view, requiring out-of-view suppression. In this example, MRF T1 and T2 maps were obtained with and without out-of-view suppression from three healthy volunteers. A variable-density spiral trajectory was used and the out-of-view suppression was determined using the outer pixels of intermediary coil images reconstructed at 600×600 mm$^2$ field-of-view. FIG. 3 shows images illustrating various stages of a method for suppression of out-of-view artifacts for an example application to cardiac MRF in accordance with an embodiment. Suppression of out-of-view aliasing using adaptive coil combination was performed in this example as follows. First, unsuppressed images 302 were reconstructed at twice the desired field-of-view. The noise covariance was determined for the parallel receive coils using a region of interest 304 outside the desired field-of-view. Using the covariance information, adaptive coil combination was applied to generate a coil image 306, reducing the severity of aliasing within the desired field-of-view. The same coil combination is applied to grid each frame of the MRF image sequence with suppressed out-of-view artifacts as shown by image 308.

Figure 4:
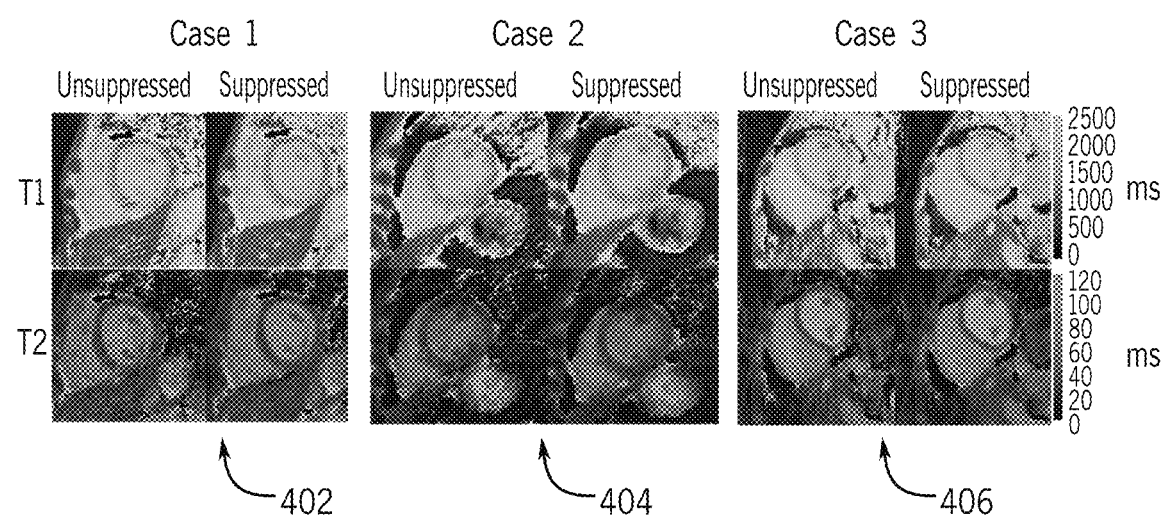
FIG. 4 shows example cardiac MRF T1 and T2 maps with and without out-of-view artifact suppression in accordance with an embodiment.

Quantitative T1 and T2 maps were then computed using the coil-combined, artifact-reduced images by pattern matching or other MRF reconstruction techniques. FIG. 4 shows example cardiac MRF T1 and T2 maps with and without out-of-view artifact suppression for three cases in accordance with an embodiment. T1 and T2 maps for a first case 402 without out-of-view suppression are shown in the left column and T1 and T2 maps with out-of-view suppression are shown in the right column. T1 and T2 maps for a second case 404 without out-of-view suppression are shown in the left column and T1 and T2 maps with out-of-view suppression are shown in the right column. T1 and T2 maps for a third case 406 without out-of-view suppression are shown in the left column and T1 and T2 maps with out-of-view suppression are shown in the right column. Without out-of-view suppression, cMRF maps suffer from high-frequency streaks in the liver and myocardium as shown in the first case 402. Without out-of-view suppression, cMRF maps also suffer from "wave-like" artifacts in the T1 and T2 maps as shown in the second case 404. Without out-of-view suppression, cMRF maps also suffer from streak artifacts in the liver, right ventricle, and left ventricle myocardium as shown in the third case 406. In all three cases 402, 404, 406, artifacts were reduced with the use of out-of-view artifact suppression.

The out-of-view artifact suppression technique disclosed herein reduces aliasing from structures outside the desired field-of-view without the need for manual selection of structures by a user. Suppression of out-of-view artifacts improves the SNR of MRF data as compared to the conventional approach, leading to T1 and T2 maps with higher image quality. Such improvements in SNR can potentially enable improvements in spatial resolution, temporal resolution, and/or reduction if MRI exam time. Although examples described above show application in cardiac imaging, the out-of-view artifact suppression may be used for any application where objects outside the field-of-view produce appreciable aliasing artifacts, e.g., coronal imaging of the abdomen, sagittal/coronal imaging of the head, etc.

Computer-executable instructions for suppression of out-of-view artifacts in magnetic resonance fingerprinting according to the above-described methods may be stored on a form of computer readable media. Computer readable media includes volatile and nonvolatile, removable, and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital volatile disks (DVD) or other optical storage, magnetic cassettes, magnetic tape, magnetic disk storage or other magnetic storage devices, or any other medium which can be used to store the desired instructions and which may be accessed by a system (e.g., a computer), including by internet or other computer network form of access.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for magnetic resonance fingerprinting with out-of-view artifact suppression, the method comprising:
    acquiring MRF data from a region of interest in a subject using the MRI system, wherein the MRF data is acquired using a non-Cartesian, variable density sampling trajectory and wherein the MRF data includes data from within a desired field-of-view and data from outside the desired field-of-view;
    generating a set of coil images based on the MRF data with a field-of-view larger than the desired field-of-view;
    determining a noise covariance based on the MRF data from outside the desired field-of-view;
    generating a coil combined image using an adaptive coil combination determined based on the noise covariance;
    applying the adaptive coil combination to the MRF data to grid each frame of the MRF data and generate MRF data with out-of-view artifact suppression;
    comparing the MRF data with out-of-view artifact suppression to an MRF dictionary to identify at least one property of the MRF data; and
    generating a report indicating the at least one property of the MRF data.

2. The method according to claim 1, wherein the set of coil images is a time-averaged set of coil images.

3. The method according to claim 1, wherein the coil combined image is given by:

$$I(x,y)=\Sigma_{j=1}^{N}m_j*\overline{C}_{j(x,y)}.$$

4. The method according to claim 3, wherein the coil combination $m_j$ is determined using the eigenvalue decomposition of the matrix $P=R_n^{-1}R_S$, where $R_S$ is the signal coil covariance matrix and $R_n$ is the noise coil covariance.

5. The method according to claim 1, wherein applying the adaptive coil combination to the MRF data may be given by:

$$I(x,y,t)=\Sigma_{j=1}^{N}m_j*C_j(x,y,t).$$

6. The method according to claim 1, wherein the set of MRF data is acquired using a parallel receive coil array.

7. A magnetic resonance fingerprinting (MRF) system comprising:
    a magnet system configured to generate a polarizing magnetic field about at least a portion of a subject;
    a magnetic gradient system including a plurality of magnetic gradient coils configured to apply at least one magnetic gradient field to the polarizing magnetic field;
    a radio frequency (RF) system configured to apply an RF field to the subject and to receive magnetic resonance signals from the subject using a coil array; and
    a computer system programmed to:
        acquire MRF data from a region of interest in a subject using the MRI system, wherein the MRF data is acquired using a non-Cartesian, variable density sampling trajectory and wherein the MRF data includes data from within a desired field-of-view and data from outside the desired field-of-view;
        generate a set of coil images based on the MRF data with a field-of-view larger than the desired field-of-view;
        determine a noise covariance based on the MRF data from outside the desired field-of-view;
        generate a coil combined image using an adaptive coil combination determined based on the noise covariance;
        apply the adaptive coil combination to the MRF data to grid each frame of the MRF data and generate MRF data with out-of-view artifact suppression;
        compare the MRF data with out-of-view artifact suppression to an MRF dictionary to identify at least one property of the MRF data; and
        generate a report indicating the at least one property of the MRF data.

8. The system according to claim 7, wherein the set of coil images is a time-averaged set of coil images.

9. The system according to claim 7, wherein the coil combined image is given by:

$$I(x,y)=\Sigma_{j=1}^{N}m_j*\overline{C}_j(x,y).$$

10. The system according to claim 9, wherein the coil combination $m_j$ is determined using the eigenvalue decomposition of the matrix $P=R_n^{-1}R_S$, where $R_S$ is the signal coil covariance matrix and $R_n$ is the noise coil covariance.

11. The system according to claim 7, wherein applying the adaptive coil combination to the MRF data may be given by:

$$I(x,y,t)=\Sigma_{j=1}^{N}m_j*C_j(x,y,t).$$

12. The system according to claim 7, wherein the RF system includes a parallel receive coil array and the MRF data is acquired using the parallel receive coil array.

* * * * *